(12) United States Patent
Hashimoto et al.

(10) Patent No.: US 8,649,408 B2
(45) Date of Patent: Feb. 11, 2014

(54) SEMICONDUCTOR LASER DEVICE

(75) Inventors: Rei Hashimoto, Tokyo (JP); Maki Sugai, Tokyo (JP); Jongil Hwang, Kanagawa (JP); Yasushi Hattori, Kanagawa (JP); Shinji Saito, Kanagawa (JP); Masaki Tohyama, Kanagawa (JP); Shinya Nunoue, Chiba (JP)

(73) Assignee: Kabushiki Kaisha Toshiba, Tokyo (JP)

(*) Notice: Subject to any disclaimer, the term of this patent is extended or adjusted under 35 U.S.C. 154(b) by 353 days.

(21) Appl. No.: 12/874,440

(22) Filed: Sep. 2, 2010

(65) Prior Publication Data

US 2011/0216799 A1  Sep. 8, 2011

(30) Foreign Application Priority Data

Mar. 4, 2010  (JP) ................................ 2010-048078

(51) Int. Cl.
*H01S 5/00* (2006.01)

(52) U.S. Cl.
USPC ....... 372/46.012; 372/33; 372/34; 372/43.01; 372/50.1

(58) Field of Classification Search
USPC ................................ 372/43.01–50.23, 33, 34
See application file for complete search history.

(56) References Cited

U.S. PATENT DOCUMENTS

| | | | | |
|---|---|---|---|---|
| 4,677,633 A | * | 6/1987 | Yamamoto et al. | 372/45.01 |
| 6,185,238 B1 | * | 2/2001 | Onomura et al. | 372/46.01 |
| 6,904,071 B1 | * | 6/2005 | Goto et al. | 372/43.01 |
| 8,477,820 B2 | * | 7/2013 | Onishi | 372/50.11 |
| 2002/0154664 A1 | * | 10/2002 | Okubo | 372/45 |
| 2003/0210721 A1 | * | 11/2003 | Haneda et al. | 372/46 |
| 2006/0043409 A1 | | 3/2006 | Ohmi | |
| 2007/0064758 A1 | * | 3/2007 | Kuramoto et al. | 372/43.01 |

FOREIGN PATENT DOCUMENTS

| | | |
|---|---|---|
| EP | 1 005 123 B1 | 5/2000 |
| JP | 63-126289 | * 11/1986 |
| JP | 2006-66660 | 3/2006 |
| JP | 2008-28219 | 2/2008 |
| JP | 2009-4645 | 1/2009 |

OTHER PUBLICATIONS

Japanese Office Action dated Mar. 13, 2012, in Japanese Patent Application No. 2010-048078 filed Mar. 4, 2010 (with English Translation).

* cited by examiner

*Primary Examiner* — Jessica Stultz
*Assistant Examiner* — Delma R Forde
(74) *Attorney, Agent, or Firm* — Oblon, Spivak, McClelland, Maier & Neustadt, L.L.P.

(57) ABSTRACT

According to one embodiment, a semiconductor laser device with high reliability and excellent heat dissipation is provided. The semiconductor laser device includes an active layer, a p-type semiconductor layer on the active layer, a pair of grooves formed by etching into the p-type semiconductor layer, a stripe sandwiched by the pair of grooves and having shape of ridge, and a pair of buried layers made of insulator to bury the grooves. The bottom surfaces of the grooves are shallower with an increase in distance from the stripe.

10 Claims, 12 Drawing Sheets

FIG.2A
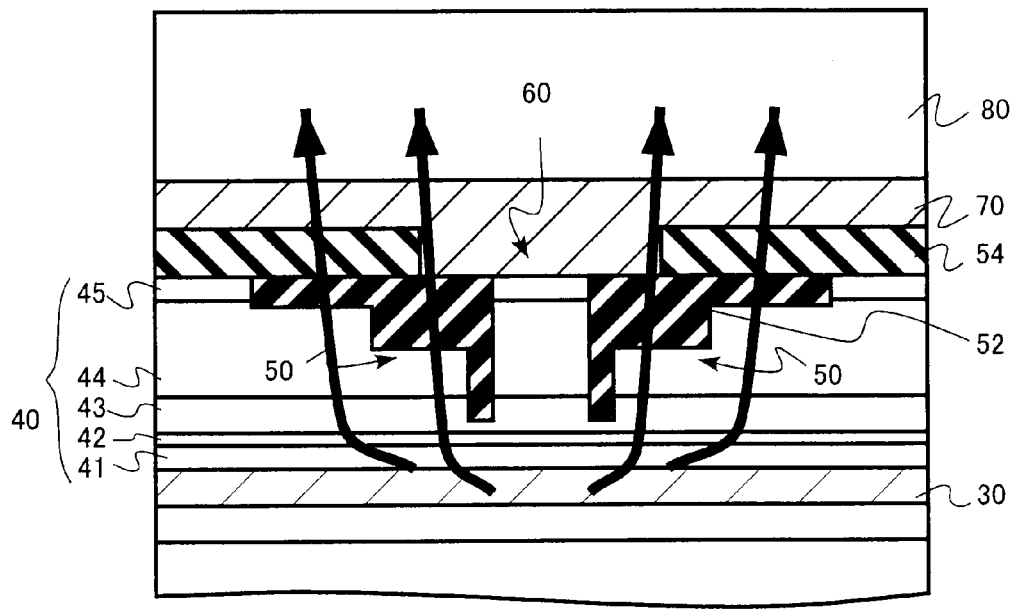
FIG.2B          PRIOR ART
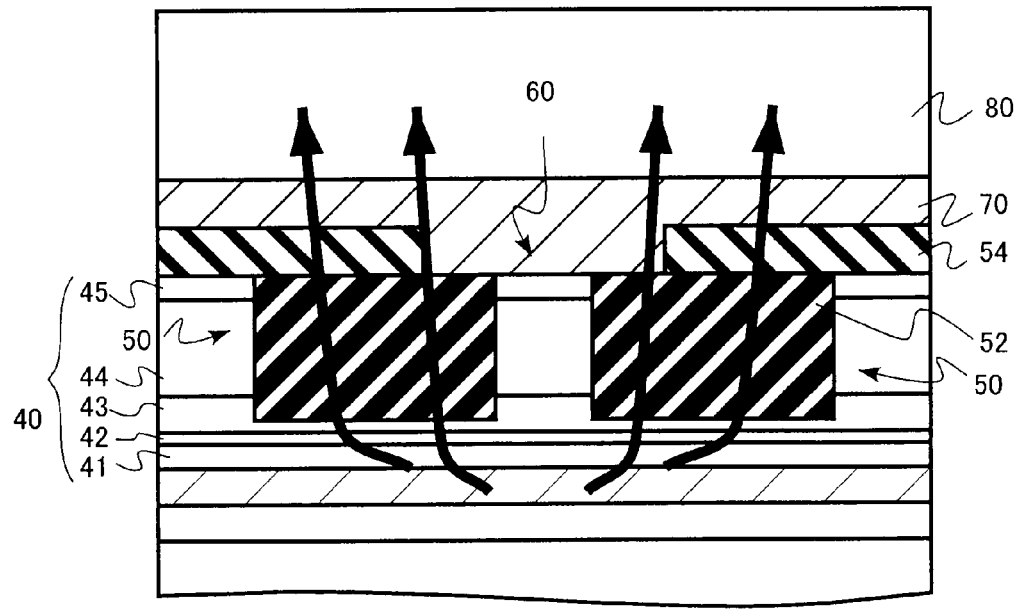

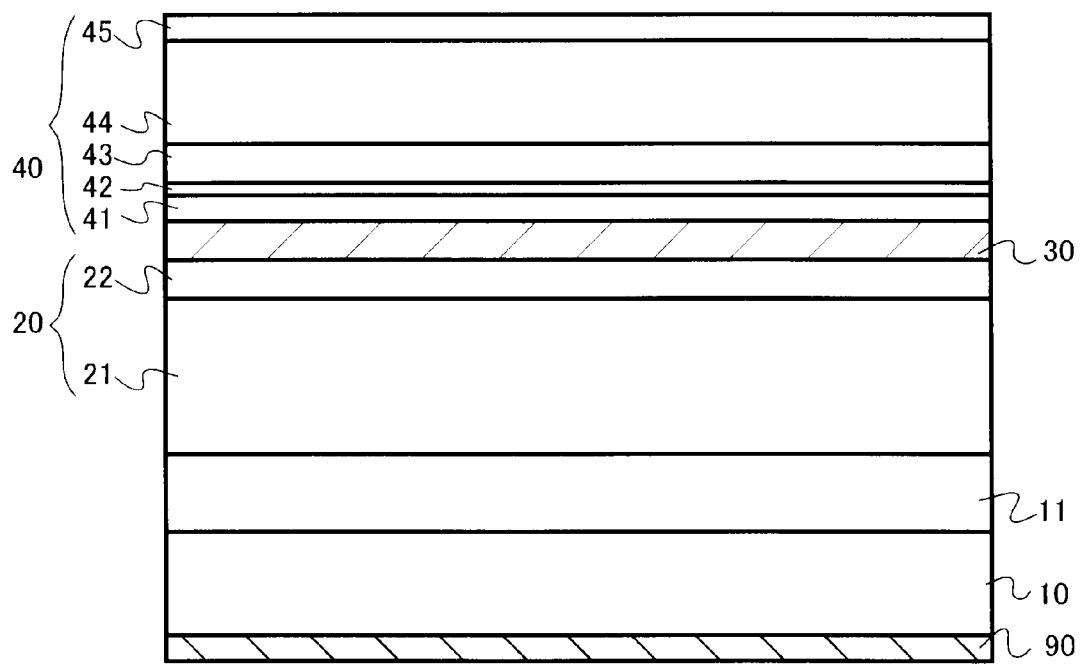

SEMICONDUCTOR LASER DEVICE

CROSS-REFERENCE TO RELATED APPLICATION

This application is based upon and claims the benefit of priority from Japanese Patent Application No. 2010-048078, filed on Mar. 4, 2010, the entire contents of which are incorporated herein by reference.

FIELD

Embodiments described herein relate generally to a semiconductor laser device.

BACKGROUND

Recently, studies and developments of semiconductor lasers (LD) have been being promoted actively for applications, such as pickups for optical disks, processing and pointers, and further television sets and projectors. Among such applications, the particular applications require high-power driving of LDs. In these applications, heat generation from the LDs is large, and therefore improvement in heat dissipation is strongly demanded.

For a high-power LD, a method called junction-down mounting is typically used in order to improve the heat dissipation. In this method, the vicinity of an active layer, which is the main heating portion in the LD, is mounted near a heat dissipation member to improve the heat dissipation.

In what is known as a ridge-waveguide semiconductor laser, which has a ridge-shaped stripe, the side surface of a ridge is buried with a metallic oxide-based insulating film of $ZrO_2$, $SiO_2$ or the like having a very poor thermal conductivity. Therefore, when junction-down mounting is performed, less heat can conduct from an active layer portion directly under the ridge, which functions as the main heat source, via an insulator area of the side surface of the ridge. This becomes a factor in reducing the heat dissipation.

For example, a technique of burying the side surface of the ridge with AlN or AlGaN having a high thermal conductivity rather than the metallic oxide-based insulating film is proposed. For example, a technique of burying the side surface with AlON having a high thermal conductivity is also proposed.

Nitride-based materials, such as AlN, AlGaN and AlON, however, have large membrane stresses compared to metallic oxide-based materials. Accordingly, it is feared that minute cracks might be made in a semiconductor layer to cause adverse influence on reliability of elements.

BRIEF DESCRIPTION OF THE DRAWINGS

FIGS. 2A and 2B are views for illustrating the function of the semiconductor laser device of the first embodiment;

FIG. 3 is a schematic cross-sectional view illustrating a process of manufacturing the semiconductor laser device of the first embodiment;

DETAILED DESCRIPTION

Figure 1:
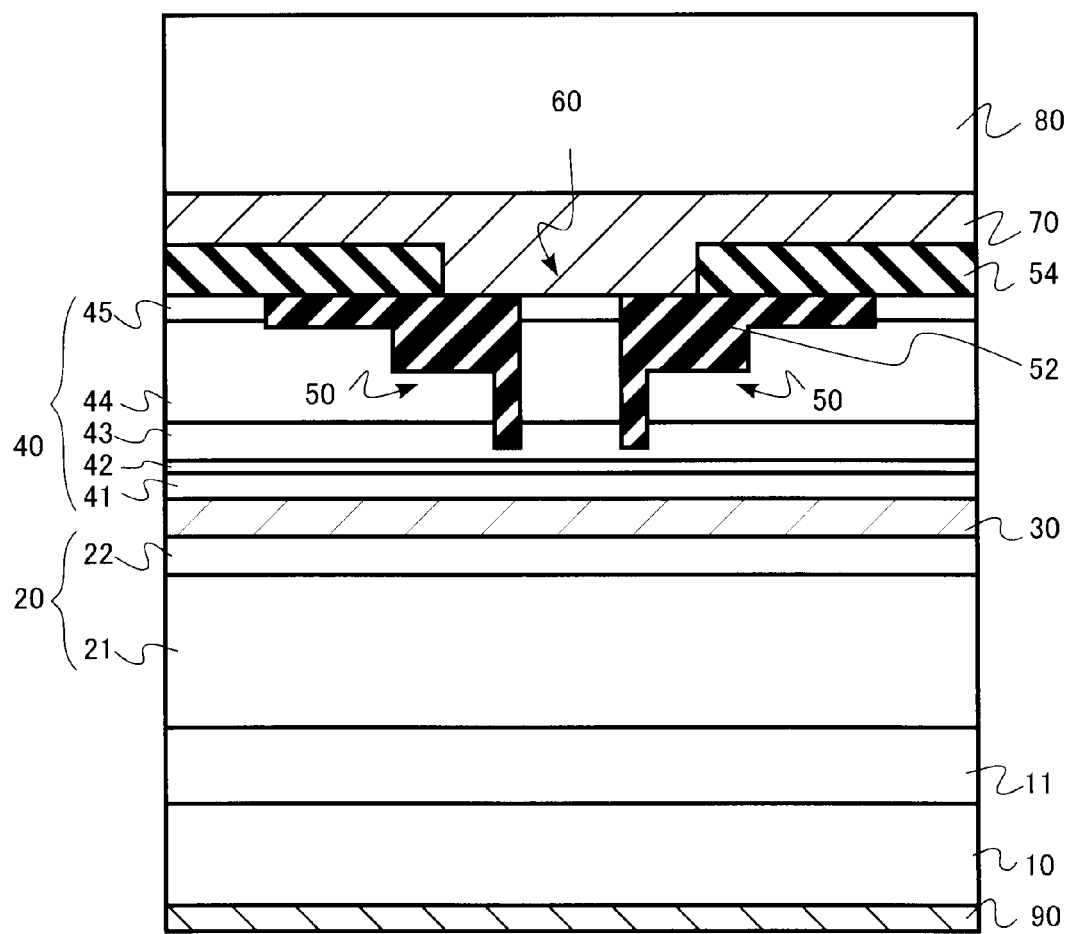
FIG. 1 is a schematic cross-sectional view of a semiconductor laser device of a first embodiment.

According to one embodiment, a semiconductor laser device with high reliability and excellent heat dissipation is provided. The semiconductor laser device includes an active layer, a p-type semiconductor layer on the active layer, a pair of grooves formed by etching into the p-type semiconductor layer, a stripe sandwiched by the pair of grooves and having shape of ridge, and a pair of buried layers made of insulator to bury the grooves. The bottom surfaces of the grooves are shallower with an increase in distance from the stripe. Embodiments are described below with reference to the accompanying drawings. In the following description of drawings, the same or similar parts are denoted by the same or similar reference numerals.

First Embodiment

A semiconductor laser device of this embodiment includes an active layer, a p-type semiconductor layer on the active layer, a pair of grooves formed by etching into the p-type semiconductor layer, a ridge-shaped stripe formed in the p-type semiconductor layer so as to be sandwiched by the pair of grooves, and a pair of buried layers of an insulator with which the grooves are buried. The semiconductor laser device has a structure in which the bottom surfaces of the grooves are shallower with an increase in distance from the stripe.

In the semiconductor laser device of this embodiment, the bottom surfaces of the grooves buried with the insulator are shallower as the distance from the stripe increases, which allows much of semiconductor layers having relatively high thermal conductivities to be left near the active layer directly under the ridge which functions as a heat source. This results in improvement of heat dissipation to a heat dissipation member which is formed on the side of the buried layers as seen from the active layer. It is thus enabled to provide a high-power semiconductor laser device with high reliability and excellent heat dissipation.

FIG. 1 is a schematic cross-sectional view of a semiconductor laser device of this embodiment. The semiconductor laser device of this embodiment is a nitride-based semiconductor laser. More specifically, it is a GaN-based blue-violet semiconductor laser. It is also a ridge-waveguide semiconductor laser having a ridge-shaped stripe.

As illustrated in FIG. 1, in the semiconductor laser device of this embodiment, an n-type GaN buffer layer 11 is formed on the main surface of a GaN substrate 10. Formed on the layer are an n-type AlGaN cladding layer 21 and an n-type GaN guide layer 22. The n-type AlGaN cladding layer 21 and the n-type GaN guide layer 22 are included in an n-type semiconductor layer 20.

Formed on the n-type GaN guide layer 22 is an active layer 30 functioning as a light emitting portion. The active layer 30 is formed in a multilayered structure of a well layer and a barrier layer. For example, InGaN layers with different In concentrations are used for the well layer and the barrier layer.

On the active layer 30, a p-type GaN first guide layer 41, a p-type AlGaN layer 42 functioning as an electron overflow blocking layer, a p-type GaN second guide layer 43, a p-type AlGaN cladding layer 44 and a p-type GaN contact layer 45 are formed in this order. The p-type GaN first guide layer 41, the p-type AlGaN layer 42, the p-type GaN second guide layer 43, the p-type AlGaN cladding layer 44 and the p-type GaN contact layer 45 are included in a p-type semiconductor layer 40.

A pair of grooves 50 is formed by etching into the p-type semiconductor layer 40. In this embodiment, the grooves 50 are formed by etching into the layer from the surface of the p-type GaN contact layer 45 to a midpoint of the p-type GaN second guide layer 43.

A ridge-shaped stripe 60 is formed in the p-type semiconductor layer 40 in such a manner as to be sandwiched by the pair of grooves 50. Further, a buried layer 52 of an insulator of a metallic oxide having a relatively small membrane stress, such as $SiO_2$ or $ZrO_2$ (zirconium oxide), for burying the grooves 50 is formed.

The bottom surfaces of the grooves 50 are step-shaped so as to be shallower with an increase in distance from the stripe 60. In accordance with the shape of the bottom surfaces of the grooves 50, the thickness of the buried layers 52 also decreases with an increase in distance from the stripe 60.

Formed on the buried layers 52 is a protective layers 54, for example, of $SiO_2$. The protective layers 54 are provided with an opening, and a p-type electrode 70, which is a metal electrode, is formed in contact with part of the top surface of the p-type semiconductor layer 40 and the top surface of the buried layers 52. The p-type electrode 70 is a multilayered film, for example, of a Ni/Au film and a Ti/Pt/Au film.

A gold-plated layer 80 is formed on the p-type electrode 70. In the case of junction-down mounting, a heat dissipation member (not illustrated) made, for example, of Cu is provided on the gold-plated layer 80 via an AnSn solder layer (not illustrated) and the like.

An n-type electrode 90 is formed on the back surface of the GaN substrate 10. The n-type electrode 90 is, for example, a Ti/Pt/Au film.

Figure 12:
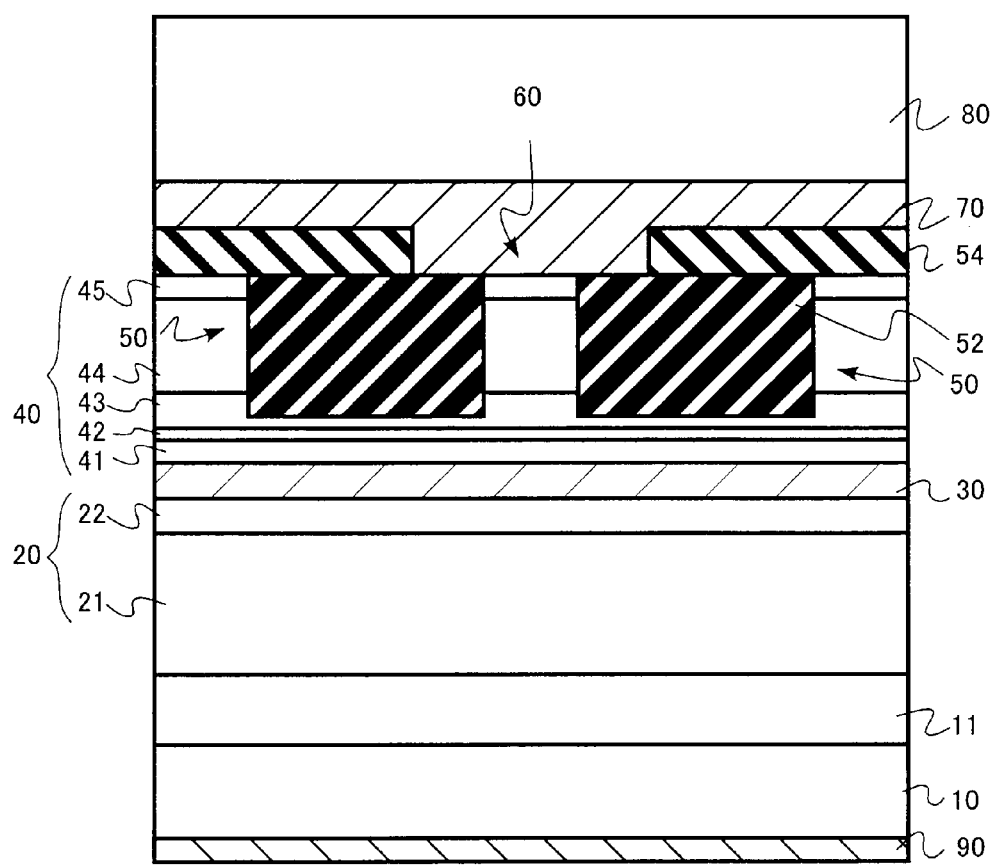
FIG. 12 is a schematic cross-sectional view of a semiconductor laser device of the related art.

FIG. 12 is a schematic cross-sectional view of a semiconductor laser device of the related art. In a conventional ridge-waveguide semiconductor laser, as illustrated in FIG. 12, the grooves 50 are cubic, and their bottom surfaces are made of horizontal surfaces.

FIGS. 2A and 2B are views for illustrating the function of the semiconductor laser device of this embodiment. FIG. 2A illustrates the semiconductor laser device of this embodiment, and FIG. 2B illustrates a semiconductor laser device of the related art. Arrows indicate heat dissipation paths.

In a ridge-waveguide semiconductor laser, when a current is injected between the p-type electrode 70 and the n-type electrode 90, the current which has been confined in a portion of the ridge-shaped stripe 60 is converted into light in the active layer 30 directly under the ridge, and, as a result, the laser oscillates. Therefore, a portion of the active layer 30 directly under the ridge becomes the main heat source.

As described above, in the case of junction-down mounting, the side of the p-type electrode 70 is brought into contact with the heat dissipation member. In a semiconductor laser having a structure as illustrated in FIG. 2B, heat generated in the active layer 30 directly under the ridge passes via the p-type semiconductor layer 40 of AlGaN or GaN having a high thermal conductivity of the order of 130 W/mK and through the buried layer 52, the p-type electrode 70 and the gold-plated layer 80, as indicated by arrows in FIG. 2B, and reaches a heat dissipation member, which is not illustrated.

However, the grooves 50, which are dug portions on side surfaces of the ridge, are buried with an insulating film of a metallic oxide having a very poor thermal conductivity of several W/mK, such as $SiO_2$ or $ZrO_2$. The buried layer 52 is therefore an area where the thermal conductivity is very poor. Accordingly, the amount of heat that can pass by the ridge to reach the heat dissipation member is very small. Consequently, there is a potential for the heat dissipation to deteriorate. In particular, in a semiconductor laser with a large amount of heat generation, there is a potential for the characteristics of elements to deteriorate.

The portion of the stripe 60 sandwiched by the grooves 50 has effects of current confinement and optical confinement. Accordingly, making the grooves 50 unduly shallow causes adverse influence, such as an increase in threshold. If the widths of the grooves 50 are made unduly small, the alignment margin of the p-type electrode 70 and the buried layer 52 (or the p-type semiconductor layer 40) is eliminated for a current to leak near the stripe 60 in some of elements. This leads to a possibility of a decrease in yields. If the widths of the grooves 50 are too small, that is, the widths of the insulators with which the grooves 50 are buried are too small, there is a possibility of weakening the optical confinement effect to result in an increase in threshold. As such, the depth and width of the grooves 50 or the buried layers 52 are values determined by the various factors such as an optical confinement effect, an effect of current blocking for suppressing leakage, and robustness of the device fabricating process.

In the semiconductor laser of this embodiment illustrated in FIG. 2A, the bottom surface of the grooves 50 are step-shaped so as to be shallower with an increase in distance from the stripe 60. Accordingly, in accordance with the shape of the bottom surfaces of the grooves 50, the thickness of the buried layers 52 also decreases with an increase in distance from the stripe 60.

Adopting this structure can improve the heat dissipation while reducing adverse influence on the optical confinement effect, the current blocking effect and robustness of the device fabricating process as described above. The optical confinement effect is mainly determined by the refractive index difference in the proximity to the active layer 30 to which a current is injected. Therefore, at the time of considering the width at a deep position of the grooves 50, the grooves need not be buried to a position far away from the active layer 30 with an insulator of $ZrO_2$ or the like. In contrast, it is impossible to make too narrow the width at a shallow position of the grooves 50 with consideration given to the robustness of the process. Therefore, in cases where the structure is adopted in which the width in a shallow area of the grooves 50 are large whereas the width in its deep area is small such that the grooves 50 are shallower with an increase in distance from the ridge, there is little adverse influence on laser characteristics.

When this structure is adopted, much of the p-type semiconductor layer 40, which uses as a material a GaN-based semiconductor having a thermal conductivity larger than that of a metallic oxide, can be left in the proximity to the active layer 30, which functions as a heating portion. Therefore, the structure of this embodiment allows a large amount of heat to be transferred from the active layer 30 to the heat dissipation member via a heat dissipation path near the ridge as indicated by arrows in FIG. 2A. Accordingly, the heat dissipation in the case of junction-down mounting improves compared to a conventional structure of FIG. 2B.

Table 1 represents comparison resulting from calculations of thermal resistance coefficients of elements between the structure of this embodiment in FIG. 2A and that of the related art in FIG. 2B.

TABLE 1

| Thermal resistance coefficient (K/W) of this embodiment | Thermal resistance coefficient (K/W) of the related art |
|---|---|
| 8.87 | 9.95 |

The thermal resistance coefficient in this embodiment is smaller than that in the related art by about 12%. This shows improvement in the heat dissipation. Use of a GaN-based semiconductor having a large thermal conductivity as in this embodiment makes more remarkable the effect of the structure in which the bottom surface of the grooves are shallower as the distance from the stripe increases.

This embodiment enables the volume of the insulator in the buried layer 52 for burying the grooves 50 to be reduced compared to the structure of the related art. Accordingly, the membrane stress is also reduced, and therefore there is an advantage of improved reliability of elements.

A method of manufacturing the semiconductor laser device of this embodiment is next described. FIGS. 3 to 8 are schematic cross-sectional views illustrating processes of manufacturing the semiconductor laser device of this embodiment.

First, as illustrated in FIG. 3, the n-type GaN buffer layer 11, the n-type AlGaN cladding layer 21, the n-type GaN guide layer 22, the active layer 30 in the multilayered structure of the well layer and the barrier layer, the p-type GaN first guide layer 41, the p-type AlGaN layer 42 functioning as an electron overflow blocking layer, the p-type GaN second guide layer 43, the p-type AlGaN cladding layer 44 and the p-type GaN contact layer 45 are formed in this order on the main surface of the n-type GaN substrate 10, for example, by a metal organic chemical vapor deposition (MOCVD) method.

A GaN layer in which, for example, Si has been doped is used as the n-type GaN buffer layer 11, and its thickness is, for example, 2000 nm. An AlGaN layer in which, for example, Si has been doped is used as the n-type AlGaN cladding layer 21, and its thickness is, for example, 2000 nm. A GaN layer in which, for example, Si has been doped is used as the n-type GaN guide layer 22, and its thickness is, for example, 70 nm.

For example, an InGaN layer is used for the well layer and the barrier layer of the active layer 30. For example, the concentration of In is varied between the well layer and the barrier layer.

A GaN layer in which, for example, Mg has been doped is used for the p-type GaN first guide layer 41, and it thickness is, for example, 30 nm. An AlGaN layer in which, for example, Mg has been doped is used for the p-type AlGaN layer 42, which functions as an electron overflow blocking layer, and its thickness is, for example, 15 nm. A GaN layer in which, for example, Mg has been doped is used for the p-type GaN second guide layer 43, and it thickness is, for example, 40 nm.

An AlGaN layer in which, for example, Mg has been doped is used for the p-type AlGaN cladding layer 44, and its thickness is, for example, 600 nm. A GaN layer in which, for example, Mg has been doped is used for the p-type GaN contact layer 45, and it thickness is, for example, 18 nm.

Figure 4:
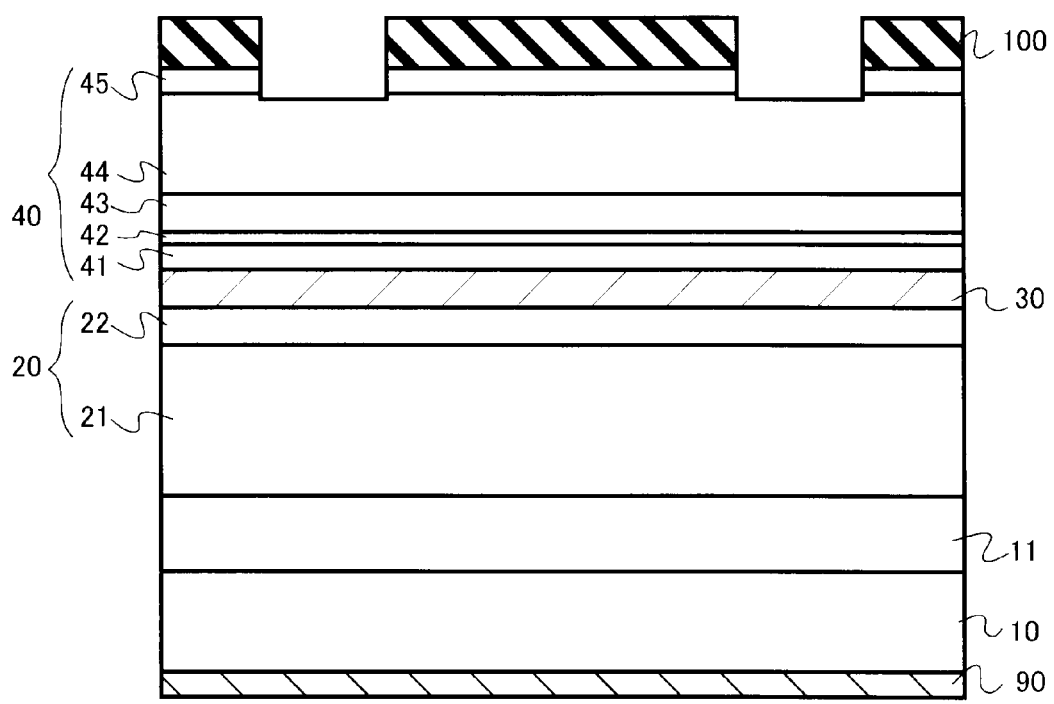
FIG. 4 is a schematic cross-sectional view illustrating a process of manufacturing the semiconductor laser device of the first embodiment.

Next, as illustrated in FIG. 4, a $SiO_2$ film 100 having a thickness, for example, of 0.9 μm is formed on such a semiconductor structure. The film formation method may be a thermal CVD method, and may also be a sputtering method. A resist pattern is formed on the $SiO_2$ film 100 by a photolithography method. The $SiO_2$ film 100 is etched by wet etching with a hydrofluoric acid-based chemical or dry etching with a fluorine-based gas to form a $SiO_2$ mask for etching into grooves near the ridge.

Using the $SiO_2$ film 100 as a mask, the p-type GaN contact layer 45 and the p-type AlGaN cladding layer 44 are dug, for example, by a reactive ion etching (RIE) method or the like to form portions of grooves near the ridge, that is, to form grooves of portions farthest from the stripe 60.

The $SiO_2$ mask formation and the RIE etching are divided into a plurality of steps, and the depth during etching is varied from one step to another. This way enables the depth of the groove near the ridge to be shallower step by step as the distance from the stripe increases.

Figure 5:
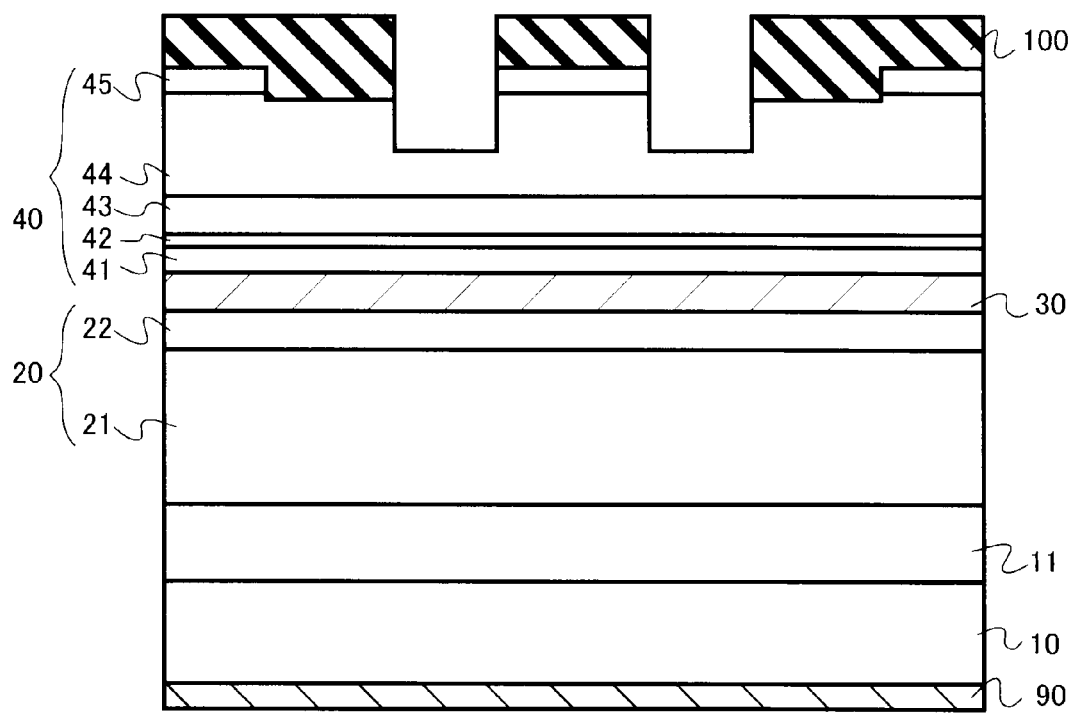
FIG. 5 is a schematic cross-sectional view illustrating a process of manufacturing the semiconductor laser device of the first embodiment.
Figure 6:
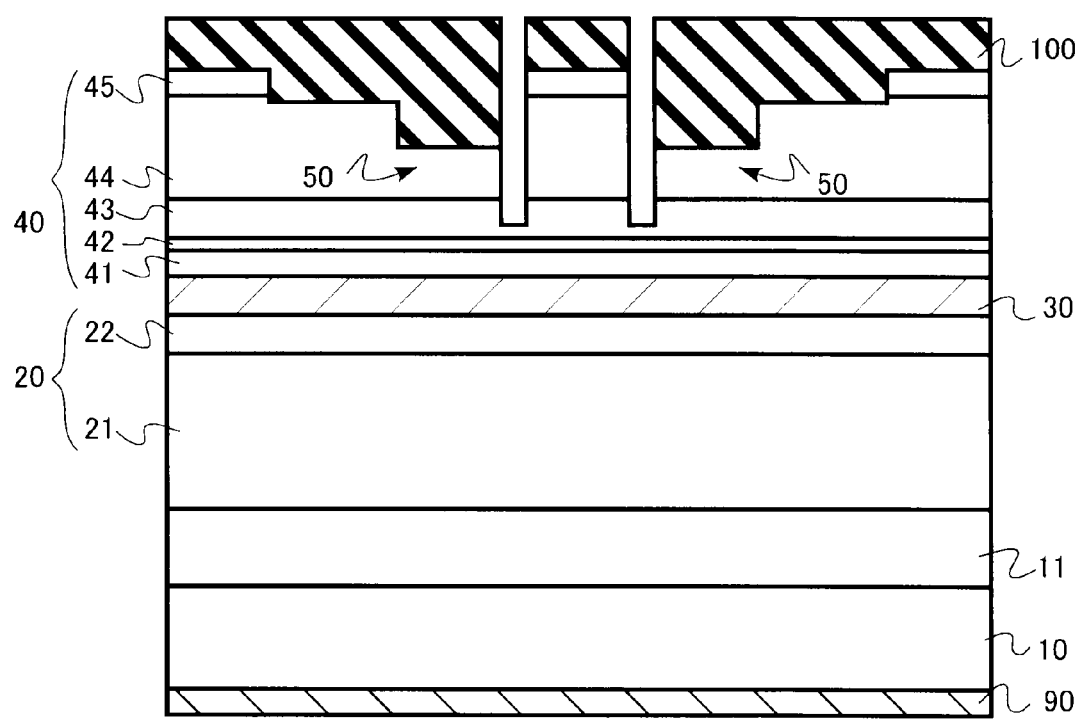
FIG. 6 is a schematic cross-sectional view illustrating a process of manufacturing the semiconductor laser device of the first embodiment.

In this embodiment, as illustrated in FIGS. 4, 5 and 6, three-time step-by-step etching is performed to form the grooves 50 in which the depth decreases in three steps. Etching depths are, for example, 650 nm, 300 nm and 50 nm. The widths of dug portions are, for example, about 1 μm at the depth of 650 nm, about 5 μm at the depth of 300 nm, and about 15 μm at the depth of 50 nm. The total width to such an extent makes easy alignment during formation of a $SiO_2$ protective layer to be described later. This can reduce the occurrence of problems such as leakage.

Figure 7:
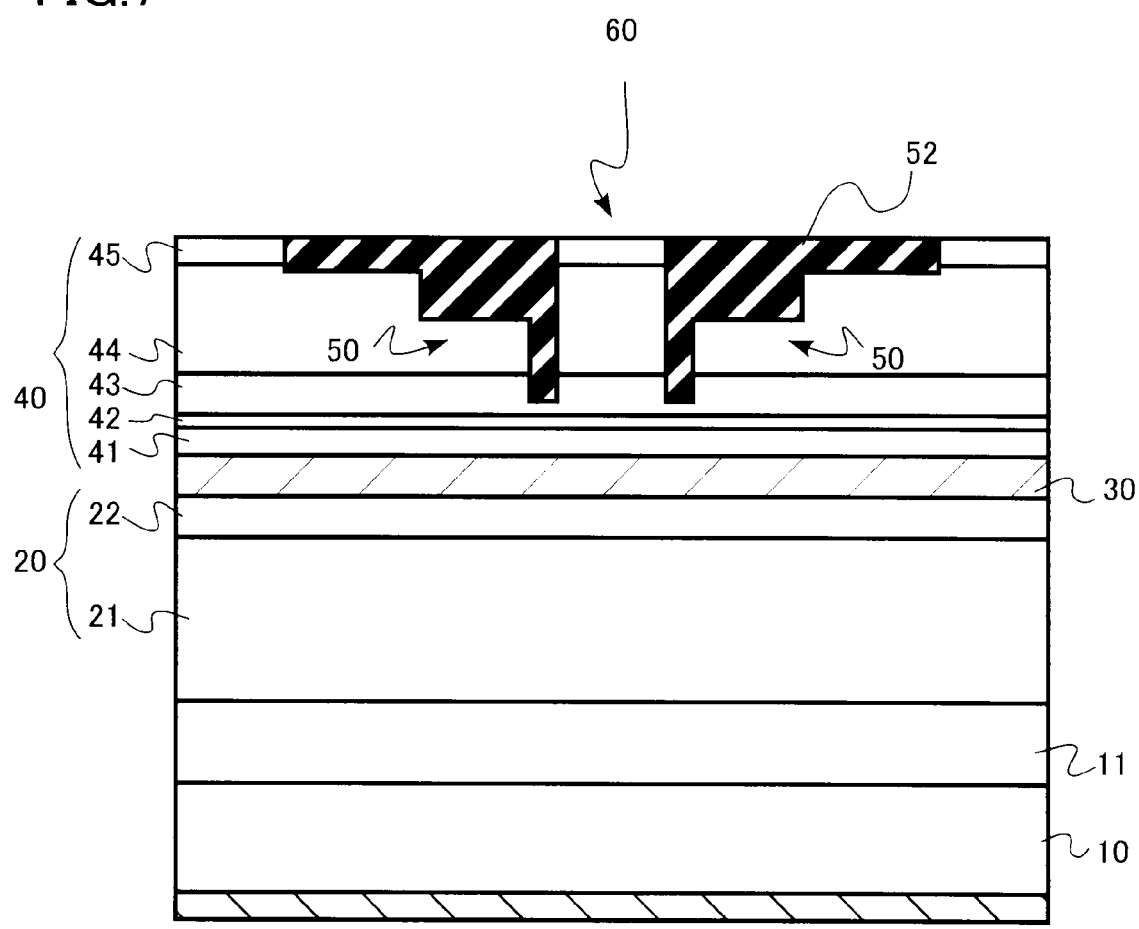
FIG. 7 is a schematic cross-sectional view illustrating a process of manufacturing the semiconductor laser device of the first embodiment.

Next, as illustrated in FIG. 7, the grooves are buried with an insulator, such as $ZrO_2$, by an electron cyclotron resonance (ECR) method to form the buried layer 52. The purpose of using the insulator for burying is to achieve current confinement and optical confinement effects in the vicinity of the active layer of the laser. While $ZrO_2$ is used as the burying material, other materials having refractive indices less than that of a GaN-based material and having insulating properties can be used.

For example, when $ZrO_2$ is used for burying, $ZrO_2$ other than that with which the grooves 50 are buried is removed by a lift-off method using a resist mask as the sacrificial layer.

Figure 8:
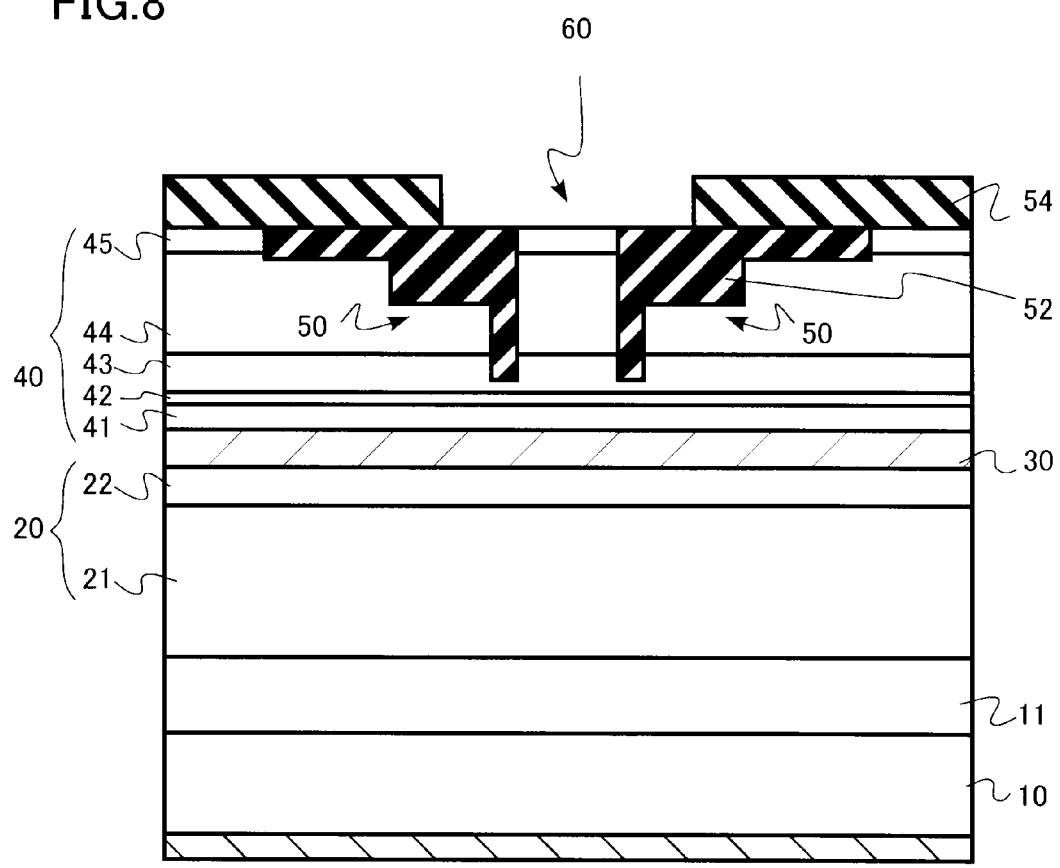
FIG. 8 is a schematic cross-sectional view illustrating a process of manufacturing the semiconductor laser device of the first embodiment.

Then, as illustrated in FIG. 8, $SiO_2$ and the like are deposited on the buried layers 52, and patterning is performed by photolithography or the like to form the protective layers 54. The protective layers 54 are, for example, formed so as to cover only about 1 μm of an end (an end distant from the ridge) of a $ZrO_2$ buried layer. If the covered area is so narrow as to create a non-covered portion, this portion causes problems such as leakage. Therefore, a larger covered area improves yields of elements. However, as described above, a metallic oxide-based material, such as $SiO_2$, has a low thermal conductivity, and therefore causes a decrease in the heat dissipation if the covered area of this material is large. For this reason, the covered area is of about 1 μm here.

On top of this layer, the p-type electrode 70 made of a multilayered film of, for example, a Ni/Au film and a Ti/Pt/Au film, and the Au-plated layer 80 are sequentially formed by an evaporation method, a plating method and the like. Further, thereafter, the GaN substrate 10 is thinned to the extent of about 150 μm by polishing, and then the n-type electrode 90 of Ti/Pt/Au or the like is formed on the side of the substrate.

From the wafer on which the ridge-shaped stripe structure and electrodes have been formed in this way, a laser bar is formed by cleavage, and reflective films are formed on the end surfaces. Then, the bar is divided into chips. In accordance with the application of a laser, the cavity length is determined, and the size of a chip is also determined. For example, the cavity length is 600 μm, and the chip width is 400 μm here.

In the way as described above, the semiconductor laser device of this embodiment illustrated in FIG. 1 can be manufactured.

Figure 9:
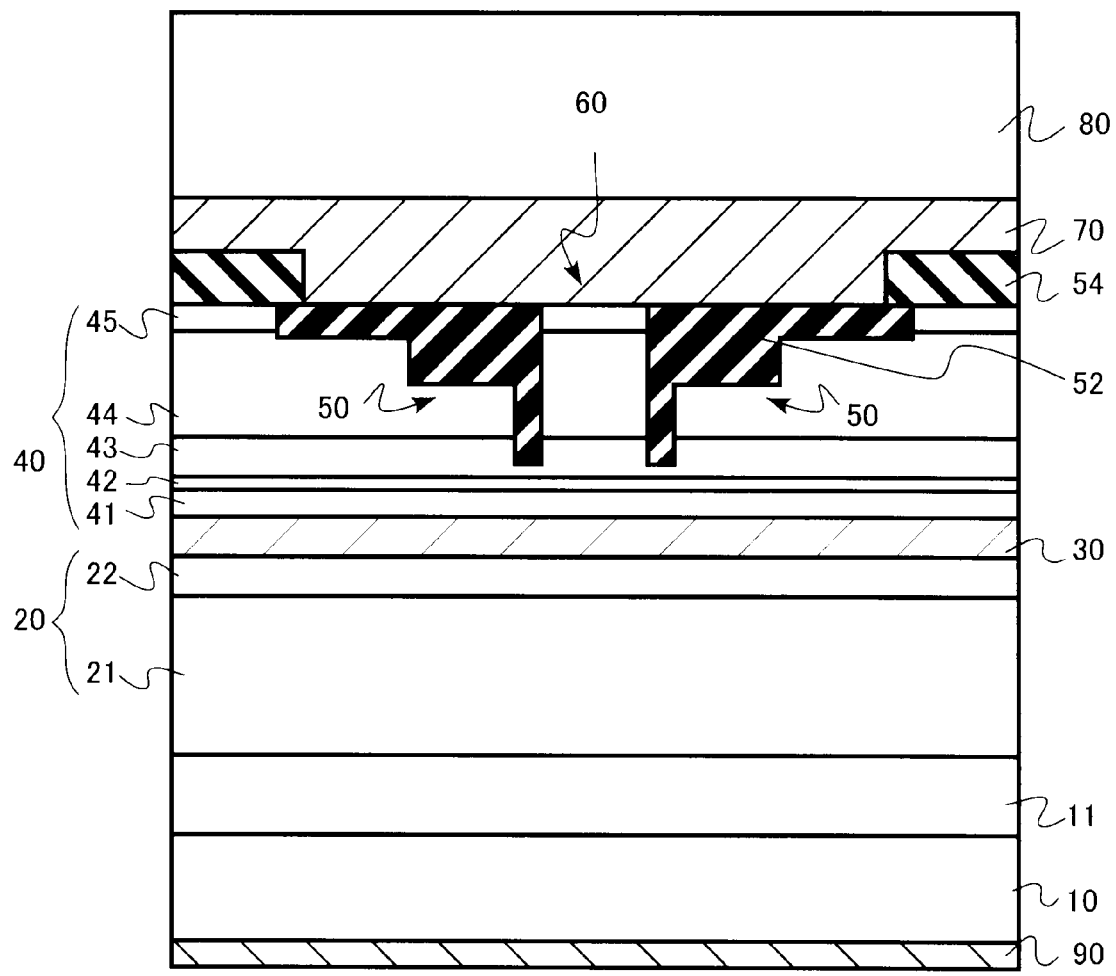
FIG. 9 is a schematic cross-sectional view of a semiconductor laser device of a modification of the first embodiment.

FIG. 9 is a schematic cross-sectional view of a semiconductor laser device of a modification of this embodiment. The semiconductor laser device of the modification differs from the semiconductor laser device illustrated in FIG. 1 in that an end of the protective layer 54 overlaps the shallowest portion of the grooves.

This structure increases the area of contact between the buried layers 52 and the p-type electrode 70 compared to that in FIG. 1, which results in a more increase in the heat dissipation. As described above, if the area of the buried layer 52 covered with the protective layer 54 is so narrow as to create a non-covered portion, this portion causes problems such as leakage. Accordingly, it is preferable that the covered area be narrow without causing remarkable reduction in yields.

As described above, according to this embodiment, it is possible to provide a high-power semiconductor laser device which has high reliability due to minimized influence of the membrane stress of the buried layers on the semiconductor layers and which is excellent in the heat dissipation because a heat dissipation path is secured by making shallower the bottom surfaces of the grooves with an increase in distance from the stripe.

Second Embodiment

A semiconductor laser device of this embodiment is similar to that of the first embodiment except that the bottom surfaces of the grooves are a smooth slope. Therefore, the same description as that of the first embodiment is omitted.

Figure 10:
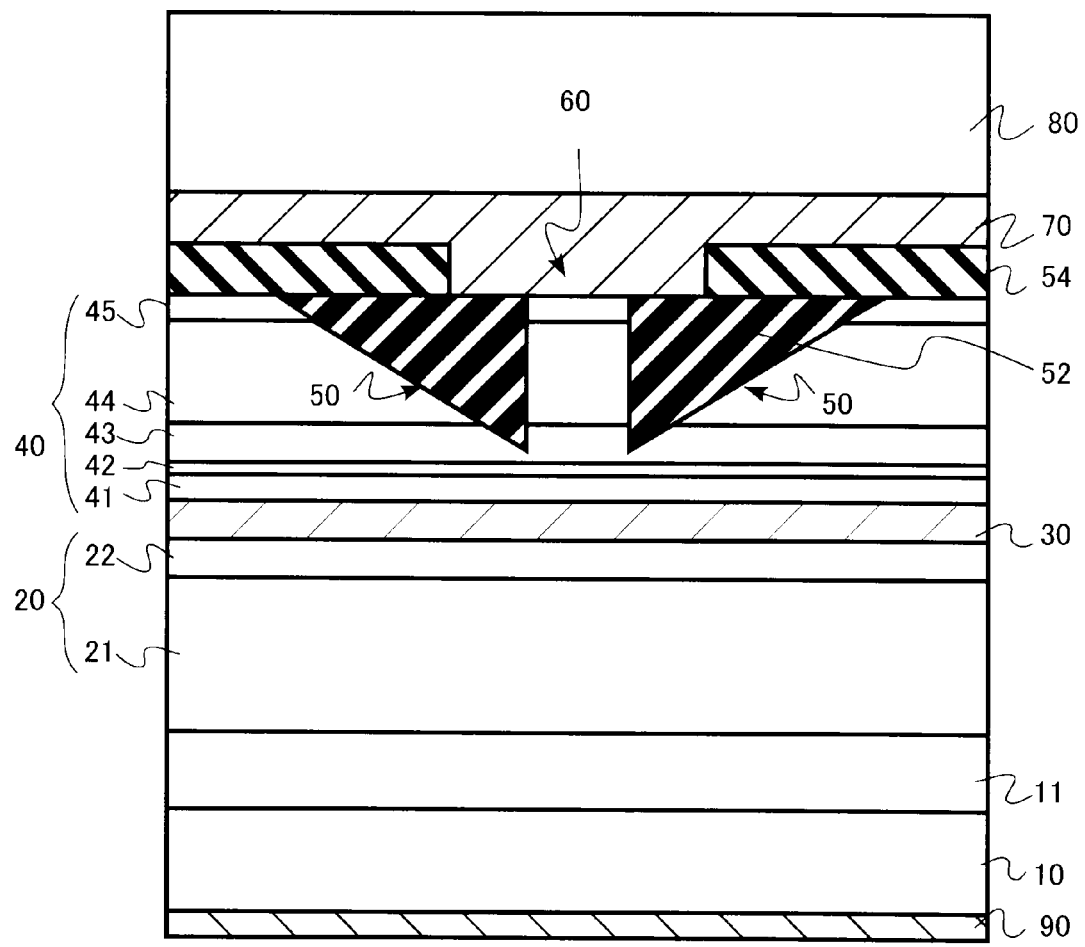
FIG. 10 is a schematic cross-sectional view of a semiconductor laser device of a second embodiment.

FIG. 10 is a schematic cross-sectional view of a semiconductor laser device of this embodiment. As illustrated in FIG. 10, the bottom surfaces of the grooves 50 are a smooth slope and are shallower with an increase in distance from the stripe.

For example, RIE to make the bottom surfaces inclined are performed during etching of the grooves 50. This enables an element having such a form to be manufactured.

According to this embodiment, the dissipation of heat generated in the active layer 30 improves compared to the first embodiment, which arises from the form of the bottom surface.

Third Embodiment

A semiconductor laser device of this embodiment is similar to that of the first embodiment except that a part of the bottom surfaces of the grooves are a smooth slope, and another part are step-shaped. Therefore, the same description as that of the first embodiment is omitted.

Figure 11:
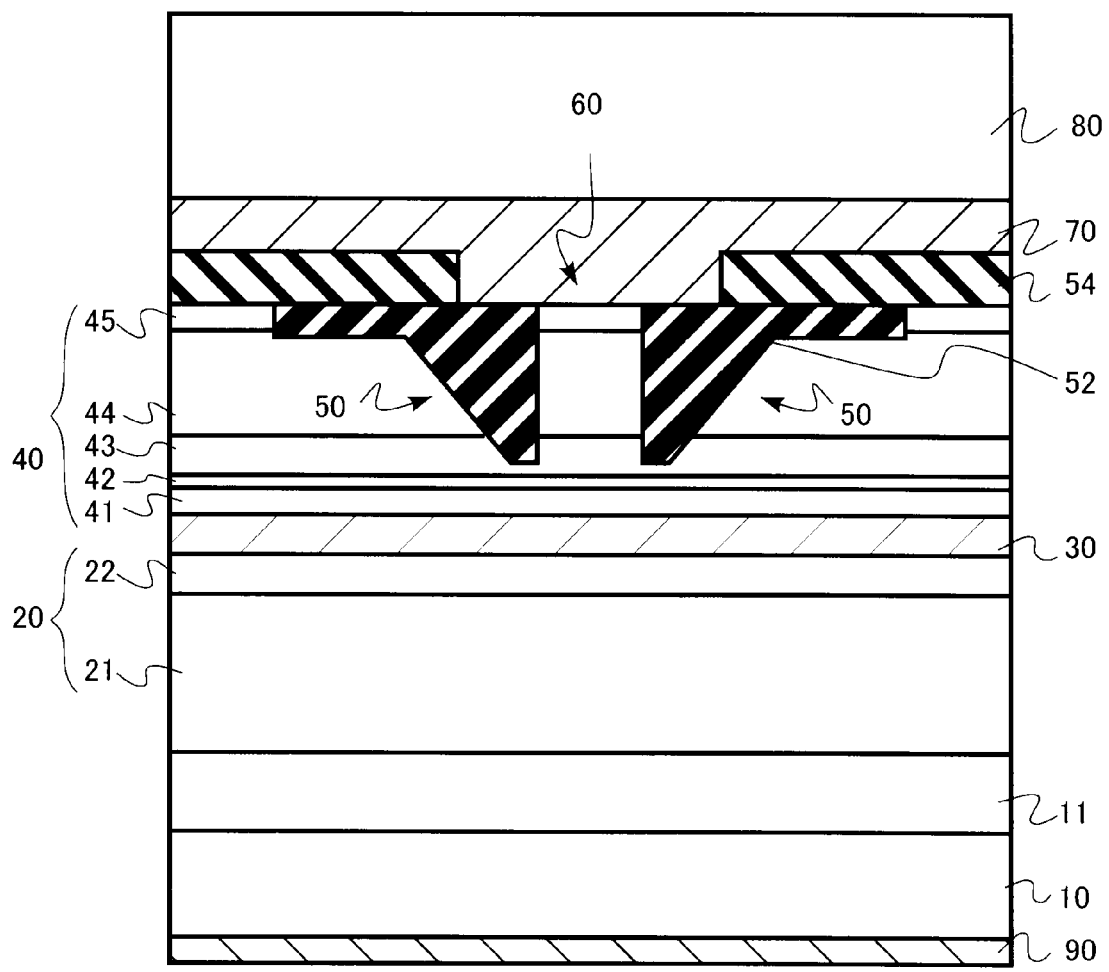
FIG. 11 is a schematic cross-sectional view of a semiconductor laser device of a third embodiment.

FIG. 11 is a schematic cross-sectional view of a semiconductor laser device of this embodiment. As illustrated in FIG. 11, an area close to the stripe 60 of the bottom surfaces of the grooves 50 are a smooth slope. However, an area including an end of the grooves 50 distant from the stripe 60 is step-shaped. The entire bottom surfaces of the grooves 50 are shallower with an increase in distance from the stripe 60.

According to this embodiment, an end distant from the stripe 60 of the grooves 50 are a vertical surface compared to that in the second embodiment. Therefore, there is an advantage that the dimension accuracy of the groove 50 improves, so that an area of the buried layers 52 covered with the protective layers 54 are easily narrowed.

While certain embodiments have been described, these embodiments have been presented by way of example only, and are not intended to limit the scope of the inventions. Indeed, the semiconductor laser device described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

While the semiconductor laser is a nitride-based semiconductor laser in embodiments, the materials system does not require a particular limitation. GaAs-based, InP-based and ZnSe-based materials may be used. While growth is made on a GaN substrate, a sapphire substrate, a SiC substrate and a Si substrate may be used. Depending on the materials system, other substrates suitable for the material may be used.

While $SiO_2$ and $ZrO_2$ have been described as examples of the insulator for burying the buried layer, $Al_2O_3$, $TaO_2$ and $HfO_2$, which are other metallic oxides, are also preferable.

While an MOCVD method has been used as the film formation method, a molecular beam epitaxy (MBE) method may be used. It would be reasonable that the combinations, compositions and thicknesses of individual semiconductor layers are changed as design matters in accordance with applications of the semiconductor laser. Likewise, the depth of the groove near the ridge, what layer is the deepest one to be dug, and the like are adjustable as design matters without departing from the scope and spirit of the invention.

What is claimed is:

1. A semiconductor laser device comprising:
    an active layer;
    a p-type semiconductor layer on the active layer;
    a pair of grooves formed by etching into the p-type semiconductor layer;
    a stripe sandwiched by the pair of grooves and having a shape of a ridge;
    a pair of buried layers made of insulator to bury the grooves;
    a protective layer made of insulator formed on the buried layers, the protective layer including an opening, the opening is wider than the width of the ridge; and
    an electrode filling the opening, the electrode contacts with an entire part of a top surface of the stripe, the electrode contacts with top surfaces of the buried layers, wherein
    bottom surfaces of the grooves at sides farther from the stripe have a shallower extent than bottom surfaces at sides closer to the stripe,
    wherein each bottom surface of the grooves includes a deepest portion that is a portion farthest vertically from the top surface of the stripe, and the deepest portion is closer to the stripe than from an edge of the grooves that is farthest from the stripe.

2. The device according to claim 1, wherein each bottom surface of the grooves includes, relative to the top surface of the stripe, a deeper extending portion and a more shallow extending portion at sides farther from the stripe.

3. The device according to claim 1, wherein at least part of the bottom surfaces of the grooves is a slope.

4. The device according to claim 1, wherein the insulator is any one of SiO2, ZrO2, Al2O3, TaO2 and HfO2.

5. The device according to claim 1, wherein the active layer and the p-type semiconductor layer are made of GaN-based semiconductor.

6. A semiconductor laser device comprising:

an active layer;

a p-type semiconductor layer on the active layer; a stripe formed in the p-type semiconductor layer and having a shape of a ridge;

a pair of grooves formed in the p-type semiconductor layer, on both side of the stripe; and a pair of buried layers made of insulator to bury the grooves;

a protective layer made of insulator formed on the buried layers, the protective layer including an opening, the opening being wider than the width of the ridge; and an electrode filling the opening, the electrode contacts with an entire part of a top surface of the stripe, the electrode contacts with top surfaces of the buried layers, wherein bottom surfaces of the grooves at sides farther from the stripe have a shallower extent than bottom surfaces at sides closer to the stripe, wherein each bottom surface of the grooves includes a deepest portion that is a portion farthest vertically from the top surface of the stripe, and the deepest portion is closer to the stripe than from an edge of the grooves that is farthest from the stripe.

7. The device according to claim 6, wherein each bottom surface of the grooves includes relative to the top surface of the stripe, a deeper extending portion and a more shallow extending portion at sides farther from the stripe.

8. The device according to claim 6, wherein at least part of the bottom surfaces of the grooves is a slope.

9. The device according to claim 6, wherein the insulator is any one of SiO2, ZrO2, Al2O3, TaO2 and HfO2.

10. The device according to claim 6, wherein the active layer and the p-type semiconductor layer are made of GaN-based semiconductor.

\* \* \* \* \*